United States Patent [19]

Haragashira

[11] Patent Number: 4,906,934

[45] Date of Patent: Mar. 6, 1990

[54] SHIM COIL FOR NUCLEAR MAGNETIC RESONANCE IMAGING APPARATUS

[75] Inventor: Motoji Haragashira, Tochigi, Japan

[73] Assignee: Kabushiki Kaisha Toshiba, Kawasaki, Japan

[21] Appl. No.: 293,191

[22] Filed: Jan. 3, 1989

[30] Foreign Application Priority Data

Jan. 13, 1988 [JP] Japan ..................................... 63-3676

[51] Int. Cl.$^4$ ........................................... G01R 33/20
[52] U.S. Cl. ..................................... 324/319; 324/322
[58] Field of Search ............... 324/300, 307, 309, 318, 324/319, 320, 322

[56] References Cited

U.S. PATENT DOCUMENTS 3,582,779  6/1977  Bloom ................................. 324/320
4,633,179 12/1986  Sugimoto ............................ 324/309
4,791,370 12/1988  MacKinnon ......................... 324/318

Primary Examiner—Michael J. Tokar
Attorney, Agent, or Firm—Foley & Lardner, Schwartz, Jeffery, Schwaab, Mack, Blumenthal & Evans

[57] ABSTRACT

A shim coil for a nuclear magnetic resonance imaging apparatus capable of being independent of influences from time varying magnetic fields generated by gradient coil. The shim coil includes primary coil for producing an extra magnetic field in accordance with a direct current to be supplied, and compensatory coil for producing a compensatory magnetic field which cancels a magnetic field produced by the primary coil means in response to an induced current due to the time varying gradient magnetic fields.

14 Claims, 4 Drawing Sheets

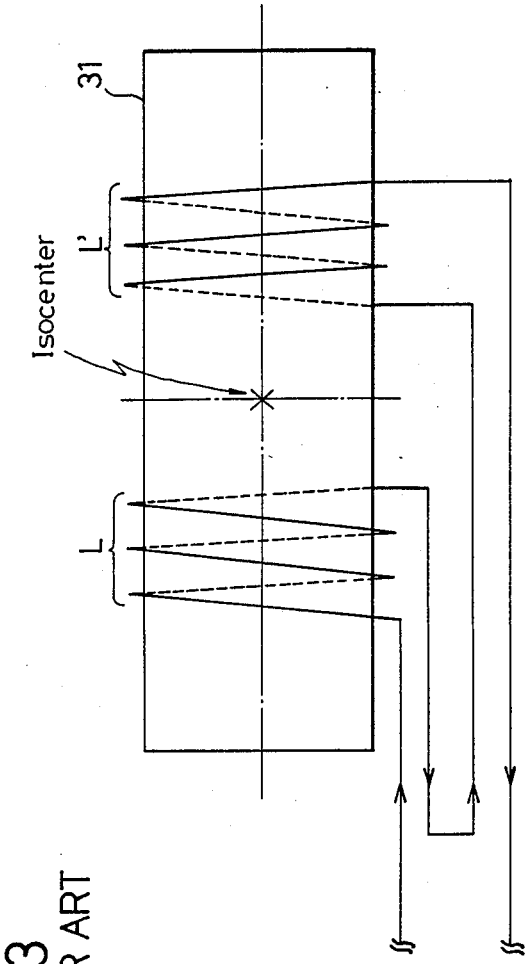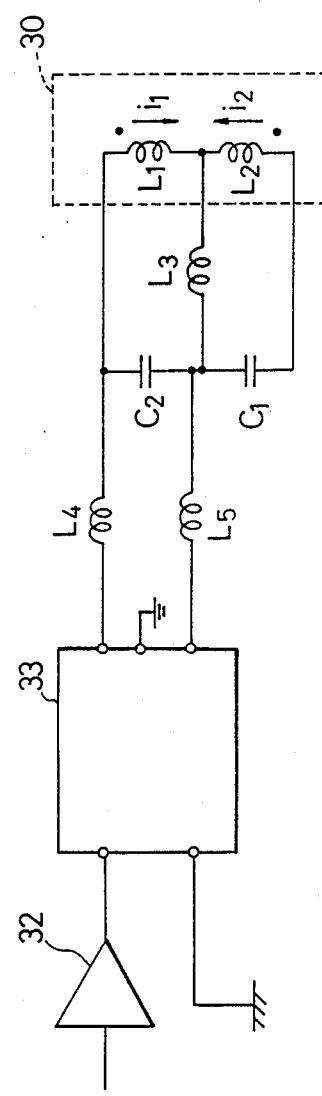
FIG.3 PRIOR ART
FIG.4

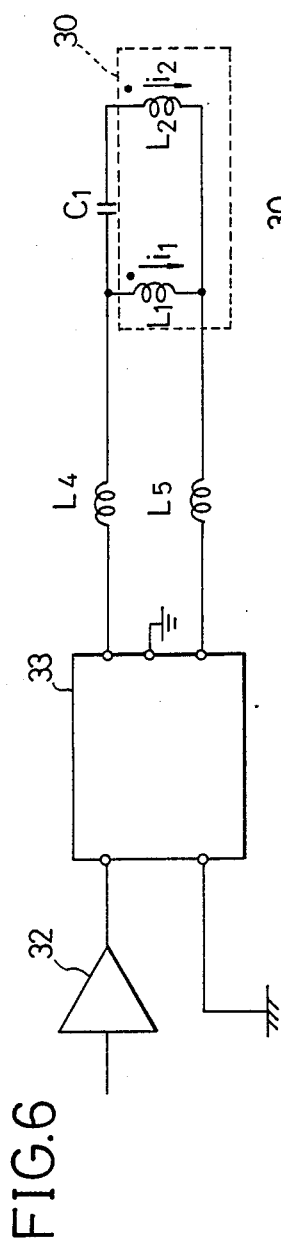
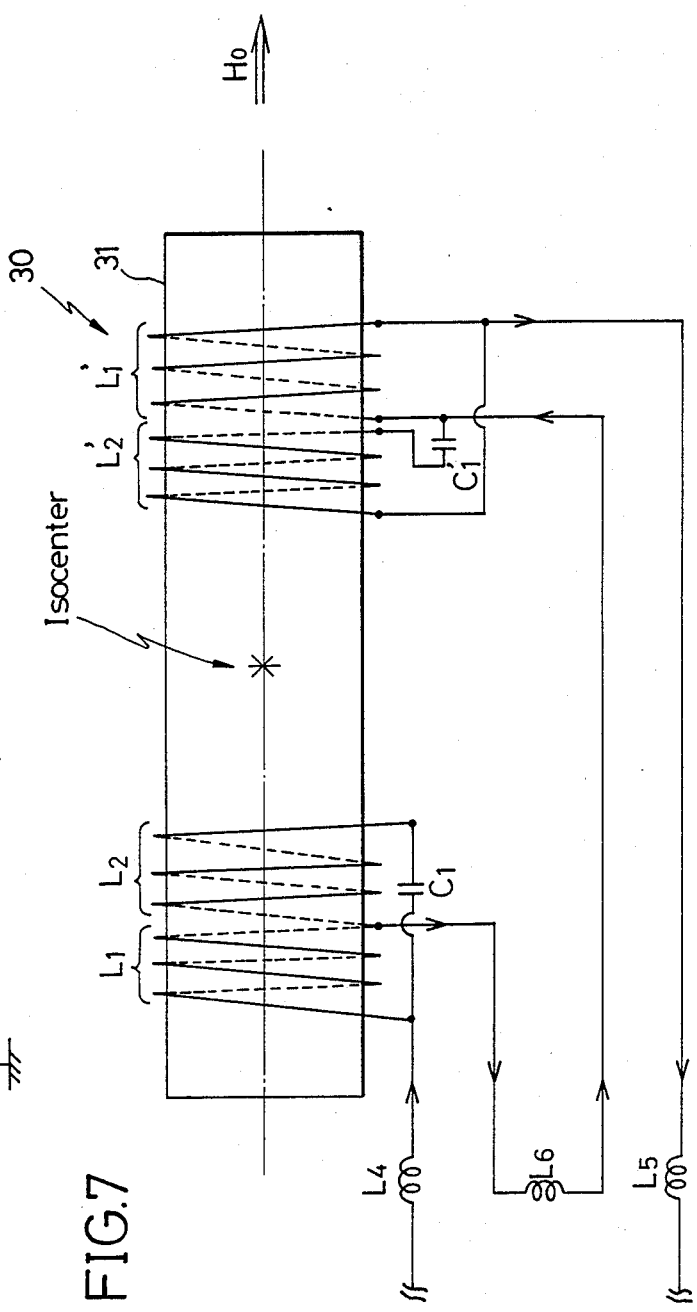
FIG.6
FIG.7

4,906,934

SHIM COIL FOR NUCLEAR MAGNETIC RESONANCE IMAGING APPARATUS

BACKGROUND OF THE INVENTION

1. Field of the Invention

The present invention relates to a shim coil, to be incorporated in a nuclear magnetic resonance imaging apparatus, for adjusting a static magnetic field to improve its homogeneity.

2. Description of the Background Art

As is well-known, in a nuclear magnetic resonance imaging apparatus (referred hereafter as an MRI apparatus), nuclear magnetic resonance signals (referred hereafter as NMR signals) are obtained from a region of interest in a body to be examined by irradiating the region with radio frequency excitation pulses (referred hereafter as RF pulses) under the presence of a static magnetic field surrounding the region, and the image reconstructions or the spectrum analyses are carried out on the basis of the obtained NMR signals.

In the case of image reconstruction, a high-resolution image is obtainable when the homogeneity of the static magnetic field in the region of interest is within the range of 1 to several ppm. However, the homogeneity of the static magnetic field can easily be disturbed beyond this range by the presence of the body to be examined.

To cope with this situation, adjustment of the homogeneity of the static magnetic field by superposing an extra magnetic field produced by a shim coil placed in the static magnetic field with various currents running through the magnitude of which determine the strength of the extra magnetic field is commonly employed. A passive shim using the induced dipole field appearing as the magnetic pieces are placed in the static magnetic field is utilized for, in practice, adjusting the static magnetic field. The adjustment by the current running shim coil has the advantage of being capable of changing the strength of the extra magnetic field and thereby adjusting the homogeneity of the static magnetic field in an active manner.

A typical configuration of such an MRI apparatus with a shim coil is shown in FIG. 1, where the system structure 10 comprises a main magnet 20 for generating a static magnetic field, a shim coil 30, a gradient coil 40 for generating gradient magnetic fields, and a probe coil 50 for irradiating RF pulses on and detecting NMR signals from a body to be examined P. The detected NMR signals are processed by a CPU 60 in an appropriate manner, and the results are shown at a display 70. The details of one typical configuration of the shim coil 30 are shown in FIG. 2, where the shim coil 30 comprises a shim coil cylinder 31 and interconnected coils L and L', and is connected to a shim coil power supply 32 which supplies constant direct current through a power supply filter 33. The power supply filter 33 is a low pass filter incorporated here in order to eliminate noise. In FIG. 2, an arrow $H_0$ indicates the direction of the static magnetic field generated by the main magnet 20, and arrows B and B' indicate the directions of the magnetic fields to be produced by the coils L and L', respectively. FIG. 3 further shows a side view of the coils L and L'.

As can be seen from FIG. 1, the shim coil 30 is normally a separate element located around the gradient coil 40, so that the coupling of the shim coil 30 and the gradient coil 40 poses the following problem.

Namely, in a conventional MRI apparatus, when currents are supplied to the gradient coil 40 in order to specify the sliced region to be excited, or to encode information concerning phase to the NMR signals, induced currents appear in the coils L and L' due to the changes in the magnetic fields produced by the gradient coil 40, causing in turn changes in the magnetic fields B and B' produced by the coils L and L', respectively.

To cope with this situation, the use of a powerful constant current supply for the shim coil 30 has been proposed, but in effect, it is not effective in eliminating the influence due to the coupling.

Thus, in a conventional MRI apparatus, it has been very difficult to eliminate undesirable situations arising due to the coupling of the shim coil 30 and the gradient coil 40.

SUMMARY OF THE INVENTION

It is therefore an object of the present invention to provide a shim coil for an MRI apparatus capable of being independent of influences from the time varying magnetic fields generated by the gradient coil.

This object is achieved in the present invention by providing a shim coil, to which a direct current is to be supplied from a power supply, to be incorporated in a nuclear magnetic resonance imaging apparatus equipped with a gradient coil for generating time varying gradient magnetic fields, the shim coil comprising: primary coil means for producing an extra magnetic field in accordance with the direct current; and compensatory coil means for producing a compensatory magnetic field which cancels a magnetic field produced by the primary coil means in response to an induced current due to the time varying gradient magnetic fields.

Other objects and features of the present invention will become apparent from the following description taken in conjunction with the accompanying drawings.

BRIEF DESCRIPTION OF THE DRAWINGS

FIG. 3 is a side view of coils of the shim coil shown in FIG. 2.

FIG. 4 is a circuit diagram of one embodiment of shim coil according to the present invention.

FIG. 6 is a circuit diagram of another embodiment of shim coil according to the present invention.

FIG. 7 is a partially illustrative circuit diagram of an exemplary configuration of the shim coil shown in FIG. 6 showing a side view of coils.

DETAILED DESCRIPTION OF THE PREFERRED EMBODIMENTS

In the following, portions of a shim coil which are equivalent to those explained above in the description of the background art will be referred by the same labels and descriptions of such portions are generally not repeated.

Referring now to FIG. 4, there is shown one embodiment of a shim coil according to the present invention.

Figure 1:
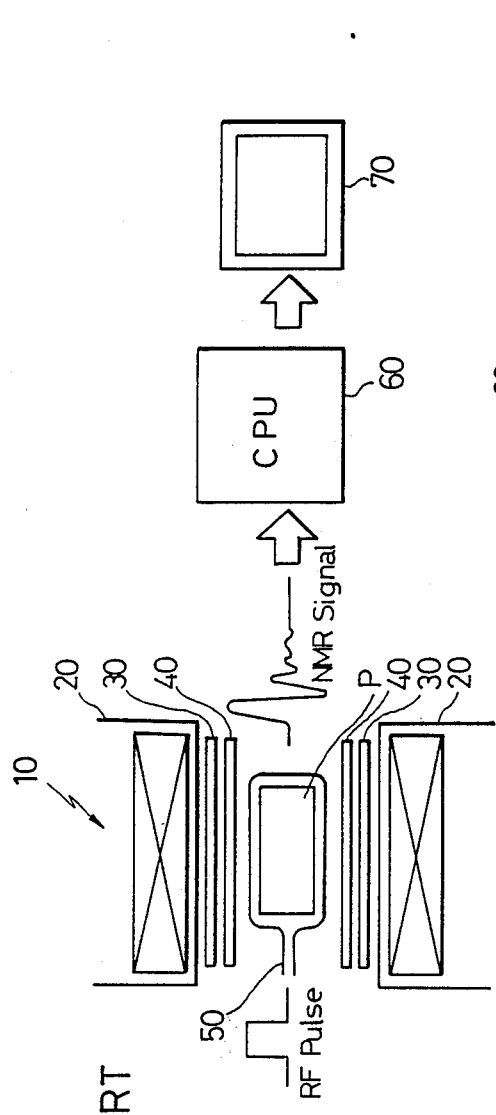
FIG. 1 is a schematic diagram of a conventional MRI apparatus.
Figure 2:
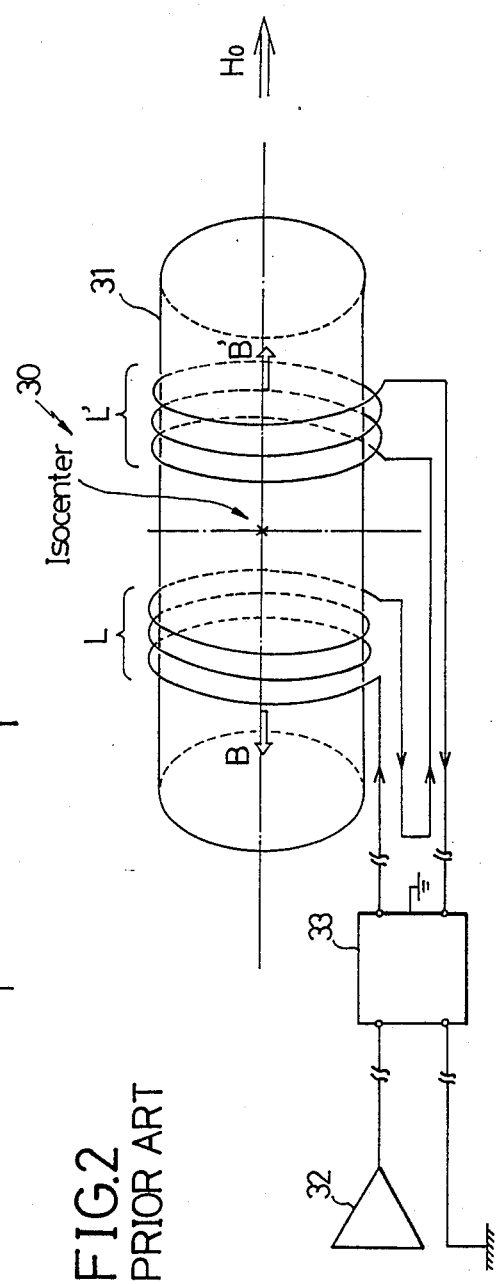
FIG. 2 is a partially illustrative circuit diagram of a conventional shim coil in the MRI apparatus shown in FIG. 1.

This shim coil comprises a primary coil $L_1$ which functions as a coil L of FIG. 2, and a compensatory coil $L_2$ having the same inductance as the primary coil $L_1$ but which is wound in an opposite direction of that in which the primary coil $L_1$ is wound. The primary coil $L_1$ and the compensatory coil $L_2$ are connected in series, and are to be arranged close by so as to have as close an amount of induction as possible.

There are also capacitors $C_1$ and $C_2$ for interrupting direct current, connected in series to the compensatory coil $L_2$ and the primary coil $L_1$, respectively.

Furthermore, there are choke coils $L_3$, $L_4$, and $L_5$, the choke coil $L_3$ being connected between one end of the primary coil $L_1$ as well as one end of the compensatory coil $L_2$, and one terminal of the power supply filter 33, the choke coil $L_4$ being connected between another terminal of the power supply filter 33 and another end of the primary coil $L_1$, the choke coil $L_5$ being connected between another end of the compensatory coil $L_2$ and the one terminal of the power supply filter 33. The choke coils $L_4$, and $L_5$ are provided for preventing back currents of the induced currents from the primary coil $L_1$ and the compensatory coil $L_2$ to the shim power supply 32 which are promoted by reduction of an output impedance of the shim power supply 32 due to the presence in the power supply filter 33 of capacitors (not shown).

The inductances of the choke coils $L_3$, $L_4$, and $L_5$ are to be sufficiently larger than those of the primary coil $L_1$ and the compensatory coil $L_2$. The capacitances of the capacitors $C_1$ and $C_2$ are to be sufficiently larger than both $1/(2\pi f)^2 L_1$ and $1/(2\pi f)^2 L_2$, where $L_1$ and $L_2$ are the inductances of the primary coil $L_1$ and the compensatory coil $L_2$, respectively, which have values of a few hundreds mH, and f is a frequency of approximately a hundred to ten thousand Hz.

With this configuration, when there is a constant current running through the gradient coil, a direct current from the shim power supply 32 runs only through the primary coil $L_1$. On the other hand, when the current running through the gradient coil varies, the time varying magnetic fields generated by the gradient coil causes induced currents $i_1$ and $i_2$ of the same magnitude but opposite directions in the primary coil $L_1$ and the compensatory coil $L_2$, respectively, as indicated in FIG. 4, so that effects due to them cancel each other.

Figure 5:
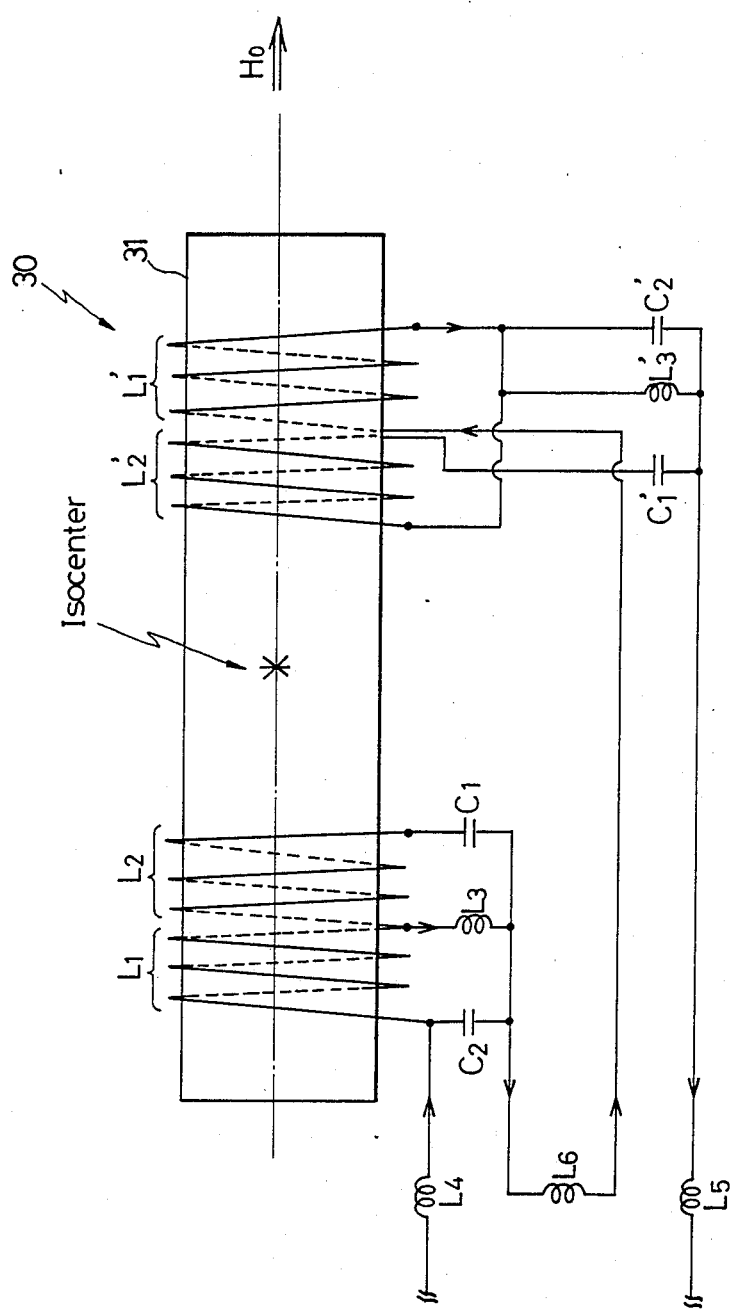
FIG. 5 is a partially illustrative circuit diagram of an exemplary configuration of the shim coil shown in FIG. 4 showing a side view of coils.

As a specific example, the shim coil having a configuration similar to that shown in FIGS. 2 and 3 with the features of this embodiment incorporated is shown in FIG. 5. Here, the primary coils $L_1$ and $L_1'$ are placed next to the compensatory coils $L_2$ and $L_2'$, respectively. Moreover, in FIG. 5, there is an additional choke coil $L_6$ provided between two primary coils $L_1$ and $L_1'$ in order to eliminate those part of the induced currents in the primary coil $L_1$ and the compensatory coil $L_2$ that do not cancel out which can have an adverse effect on the primary coil $L_1'$ and the compensatory coil $L_2'$.

Another embodiment of the present invention is shown in FIG. 6. In this embodiment, the primary coil $L_1$ and the compensatory coil $L_2$ are connected in parallel through the capacitor $C_1$ without the choke coil $L_3$, so that there is no capacitor to interrupt the direct current in a path for the direct current. It is quite obvious that this configuration can achieve the same effects as that of the previous embodiment. A specific example of this embodiment corresponding to that shown in FIG. 5 for the previous embodiment is shown in FIG. 7.

As explained, according to the present invention it is possible to provide a shim coil for an MRI apparatus capable of being independent of influences from the time varying magnetic fields generated by the gradient coil, because of the cancellation mechanism provided by the primary coil and the compensatory coil.

It is to be noted that many modifications and variations of these embodiments explained above may be made without departing from the novel and advantageous features of the present invention. Accordingly, all such modifications and variations are intended to be included within the scope of the appended claims.

What is claimed is:

1. A shim coil, to which a direct current is to be supplied from a power supply, to be incorporated in a nuclear magnetic resonance imaging apparatus equipped with a gradient coil for generating time varying gradient magnetic fields, the shim coil comprising:
   primary coil means for producing an extra magnetic field in accordance with said direct current; and
   compensatory coil means for producing a compensatory magnetic field which causes cancellation of a magnetic field produced by said primary coil means in response to an induced current due to the time varying gradient magnetic fields.

2. The shim coil of claim 1, wherein compensatory coil means has an inductance equal to that of said primary coil means, and is wound in an opposite direction of that in which said primary coil means is wound.

3. The shim coil of claim 2, wherein the primary coil means and the compensatory coil means are arranged sufficiently close to each other such that said cancellation occurs effectively.

4. The shim coil of claim 3, further comprising capacitors for interrupting said direct current into said compensatory coil means.

5. The shim coil of claim 4, wherein said primary coil means and said compensatory coil means are connected in parallel.

6. The shim coil of claim 5, further comprising choke coil means for preventing back currents of said induced current to said power supply.

7. The shim coil of claim 4, wherein said primary coil means and said compensatory coil means are connected in series.

8. The shim coil of claim 7, further comprising choke coil means for preventing back currents of said induced current to said power supply.

9. In a nuclear magnetic resonance imaging system, the combination comprising:
   a. means for producing a static magnetic field encompassing a region of interest, said static field being subject to conditions causing inhomogeneity therein;
   b. means for superimposing upon said static field an extra magnetic field for causing a net magnetic field, having a net homogeneity, upon said static field being subject to said conditions causing said inhomogeneity;
   c. means coupled to said extra field for causing transient change in said extra field; and
   d. means for compensating for said transient change without producing a field in the nature of said extra field.

10. A combination as in claim 9 wherein:
    said means for producing comprises main magnetic means;

said means for superimposing comprises shim magnetic means;
said means causing transient change comprises gradient magnetic means; and
said means for compensating comprises compensating magnetic means.

11. A combination as in claim 10 wherein:
said means for superimposing further includes means for providing a steady state source for said shim means; and
said means for compensating further includes means for blocking said steady state source from said compensating magnetic means.

12. A combination as in claim 11, wherein said shim means includes at least one shim coil; and said compensating means includes at least one compensating coil wound oppositely to said shim coil.

13. In a method for operating a nuclear magnetic resonance imaging system, the steps comprising:
a. producing a magnetic field pattern providing homogeneity in a static magnetic field in a region of interest under conditions tending to cause inhomogeneity therein; and
b. preventing time varying changes other than said conditions from affecting said magnetic field pattern.

14. In a method as in claim 13 wherein, said preventing step further includes preventing a steady state condition from affecting said magnetic field pattern.

* * * * *